United States Patent [19]

Wahlstrom

[11] Patent Number: 4,829,018
[45] Date of Patent: May 9, 1989

[54] MULTILEVEL INTEGRATED CIRCUITS EMPLOYING FUSED OXIDE LAYERS

[76] Inventor: Sven E. Wahlstrom, 570 Jackson Dr., Palo Alto, Calif. 94303

[21] Appl. No.: 879,738

[22] Filed: Jun. 27, 1986

[51] Int. Cl.$^4$ .................... H01L 21/70; H01L 27/00
[52] U.S. Cl. ........................... 437/51; 437/915; 437/84; 437/208; 437/984; 437/974; 148/DIG. 135; 148/DIG. 164; 156/657; 156/633; 357/75
[58] Field of Search ................. 357/75; 148/DIG. 12, 148/DIG. 135, DIG. 164; 156/633, 657, 653; 437/974, 984, 40, 51, 83, 84, 225, 208, 915

[56] References Cited

U.S. PATENT DOCUMENTS

| | | | |
|---|---|---|---|
| 3,508,980 | 4/1970 | Jackson, Jr. et al. | 148/DIG. 12 |
| 3,564,358 | 2/1971 | Hahnlein | 148/DIG. 164 |
| 3,959,045 | 5/1976 | Antypas | 148/DIG. 135 |
| 3,997,381 | 12/1976 | Wanlass | 156/657 |
| 4,009,057 | 2/1977 | de Brebisson et al. | 437/31 |
| 4,142,925 | 3/1979 | King et al. | 148/DIG. 135 |
| 4,169,000 | 9/1979 | Riseman | 156/645 |
| 4,309,811 | 1/1982 | Calhoun | 437/915 |
| 4,601,779 | 7/1986 | Abernathey et al. | 148/1.5 |
| 4,612,083 | 9/1986 | Yasumoto et al. | 148/DIG. 164 |
| 4,638,552 | 1/1987 | Shimbo et al. | 148/DIG. 12 |
| 4,649,627 | 3/1987 | Abernathey et al. | 148/DIG. 164 |

FOREIGN PATENT DOCUMENTS 0161740  11/1985  European Pat. Off. .... 148/DIG. 12

OTHER PUBLICATIONS

Ghandhi, *VLSI Fabrication Principles*, John Wiley and Sons, Inc., 1983.

*Primary Examiner*—Brian E. Hearn
*Assistant Examiner*—M. Wilczewski
*Attorney, Agent, or Firm*—Flehr, Hohbach, Test, Albritton & Herbert

[57] ABSTRACT

A multilevel semiconductor integrated circuit is fabricated by providing a plurality of substrates having an epitaxial layer on one surface and a silicon oxide layer on the surface of the epitaxial layer. The substrates are sequentially stacked with the silicon oxide layers in contact and fused together. One substrate is retained as a support, and other substrates are removed by etching after the fusion of the silicon oxide layers, thereby leaving only the stacked epitaxial layers separated by silicon oxide. The stacked structure facilitates the vertical fabrication of CMOS transistor pairs sharing a common gate electrode in an epitaxial layer between the two transistors. Electrical isolation between the epitaxial layers is provided by the fused silicon oxide or by removing the silicon oxide and some of the silicon thereby forming a void between adjacent epitaxial layers. Circuit devices in the plurality of epitaxial layers are readily interconnected by forming conductive vias between the epitaxial layers.

2 Claims, 7 Drawing Sheets

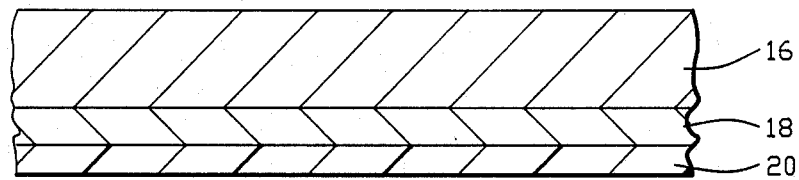
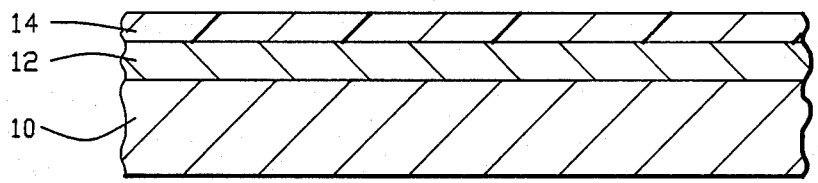
FIG.-1
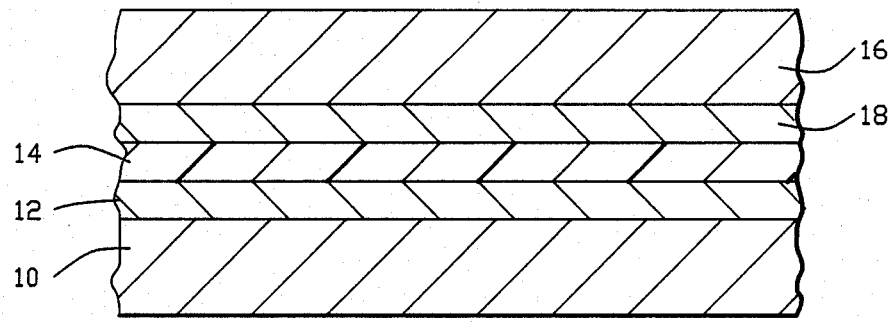
FIG.-2
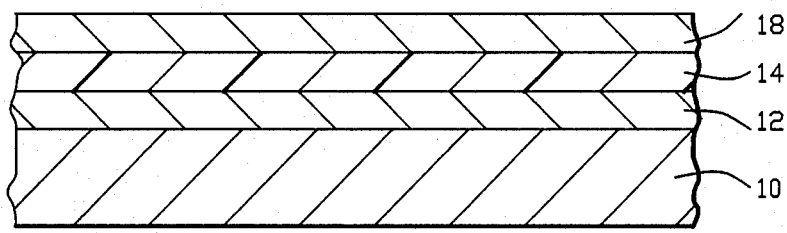
FIG.-3
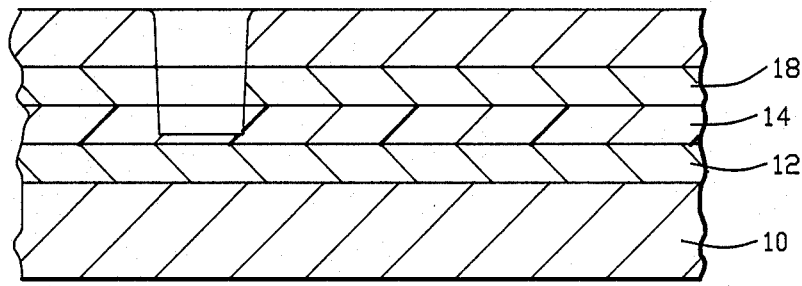
FIG.-4

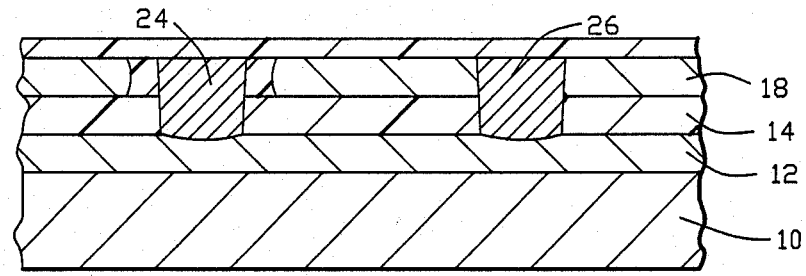
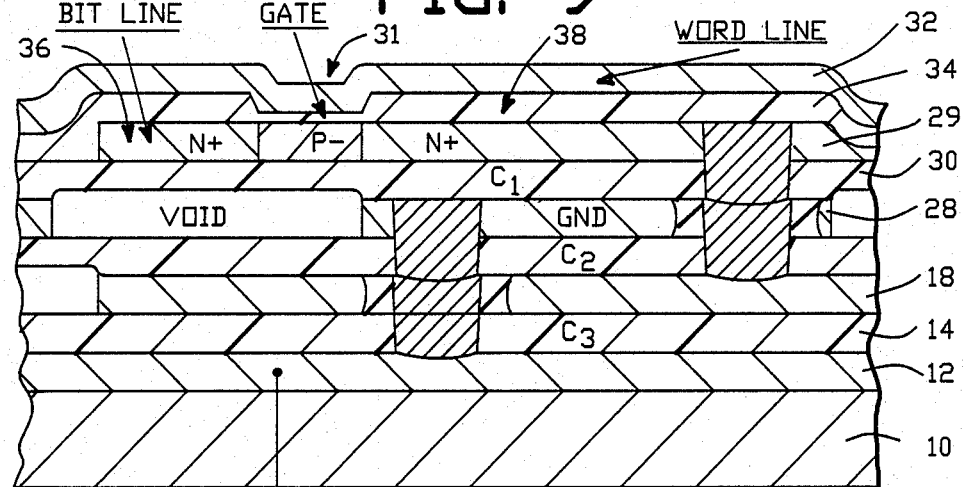
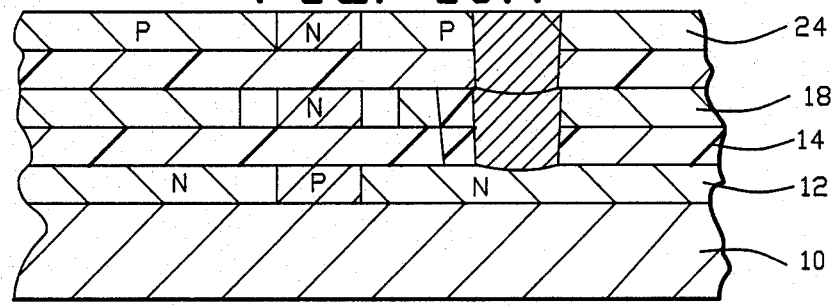
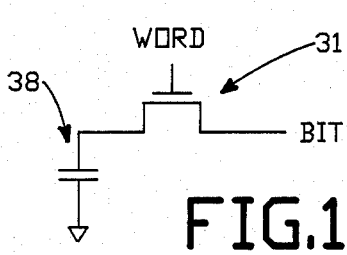
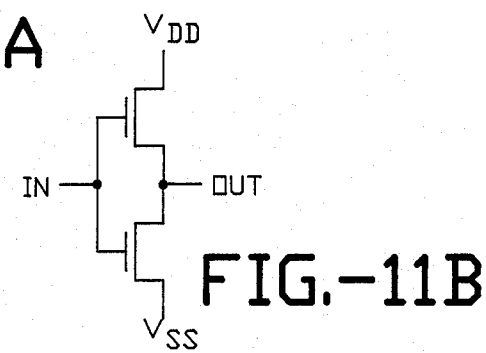

SYMBOLS FOR LAY OUT PLANNING

| | SYMBOL |
|---|---|
| N-CHANNEL SOURCE DRAIN REGION | ○ |
| GATE REGION | ◇ |
| P-CHANNEL SOURCE DRAIN REGION | ○ |
| P-CHANNEL DEVICE ONLY | ⊙ (circle with diamond inside) |
| N-CHANNEL DEVICE ONLY | ◇ (diamond with circle inside) |
| N-CHANNEL DEVICE ON TOP OF P-CHANNEL DEVICE WITH COMMON GATE | ⊚ (circle with diamond and circle inside) |
| INTER LAYER CONTACT | ⊕ |
| N+ OR SILICIDE ROUTING IN TOP LAYER | ———— |
| N+ OR SILICIDE ROUTING IN MIDDLE LAYER | – – – – |
| P+ OR SILICIDE ROUTING IN BOTTOM LAYER | —·—·— |
| TOP TO MIDDLE LAYER CONTACT | —·—⊕— — |
| MIDDLE TO BOTTOM LAYER CONTACT | —·—⊕— — — |
| 3 LAYER CONTACT | ⊕ (with three line styles) |

FIG.-13

MULTILEVEL INTEGRATED CIRCUITS EMPLOYING FUSED OXIDE LAYERS

BACKGROUND OF THE INVENTION

This invention relates generally to semiconductor integrated circuit technology, and more particularly the invention relates to multilayer integrated circuits.

The semiconductor integrated circuit is fabricated by the selective introduction of dopants into a single crystal semiconductor body through the use of photoresist masking and chemical etching of dopant barrier layers, diffusion and ion implantation of dopants through the patterns, and electrical interconnection layers. Circuit density is increased as these manufacturing techniques have improved. Typically, the integrated circuits have been fabricated in and on a single surface of a semiconductor substrate.

Greatly increased circuit density can be realized by providing layers of integrated circuits. U.S. Pat. No. 4,233,671 describes a three dimensional processor system in which a read only memory is fabricated in a polycrystalline silicon layer over a single crystal silicon substrate in which the microprocessor is fabricated. An article entitled, "Simple Wafer Fusion Builds Better Power Chips" in *Electronics* Magazine, Dec. 23, 1985, page 20, discloses the formation of PN junction device structures in which P and N type silicon wafers are bonded together to make power devices. U.S. Pat. Nos. 3,840,888 and 4,317,686 disclose discrete devices fabricated on a supporting substrate.

SUMMARY OF THE INVENTION

The present invention is directed to the fabrication of multilevel integrated circuits. The use of multilayers facilitates the fabrication of a single circuit both vertically and horizontally in the structure, thereby increasing circuit density. In accordance with one aspect of the invention CMOS transistor pairs are vertically fabricated in separate layers with a shared common gate therebetween.

A feature of the invention is the stacking of semiconductor epitaxial layers by fusing silicon oxide on the surfaces of the layers. Each epitaxial layer can accommodate a circuit and can cooperatively define circuits components such as CMOS transistors and capacitors. The bonded silicon oxide layers can provide dielectric isolation between the two semiconductor bodies. Increased dielectric isolation between circuit elements, for example, can be provided by forming voids in the fused silicon oxide layers.

The voids can serve the same purpose as the field oxide in conventional processes. A thick oxide is used to prevent turning on parasitic transistors in the layer underneath the oxide. This requires a low capacitance between the layers. Due to the approximately 3.9 times lower dielectric constant in the void as compared to silicon oxide, a relatively thin void may serve the same purposes as a thicker silicon oxide. On the other hand, parasitic transistors are formed between diffused areas in a common body of silicon with the opposite dopant, so the problem will not occur where the devices are separated by deep trenches. In such cases, the only purpose of the voids is to minimize the capacitive coupling between circuit elements in the two layers.

Another feature of the invention is the use of optical alignment techniques which are readily employed in stacking the semiconductor bodies, and circuit feedthroughs can be readily provided. The ability to align the masks for processing the top layer after fusion and thinning to the epitaxial layer is facilitated by incorporating an alignment mark in the previous layer which can be seen through the top layer.

In a preferred embodiment, an epitaxial layer is grown on the surface of a supporting substrate of single crystal material, and the surface of the epitaxial layer is oxidized. The oxidized surface is then bonded to the oxidized surface of a second, supporting substrate. Thereafter, the first substrate is removed by chemical etching. A heavily doped wafer with a thin epitaxial layer of lighter doping can be etched from the back with enough control to leave only the thin epitaxial layer. This process can be continued to form three or more layers of semiconductor material in which circuits and components can be fabricated.

The first layer may or may not be part of the support wafer. When employed as part of the support wafer, one less fusion and thinning step is required, but circuit speeds can suffer due to junction capacitances of the source and drain regions. On the other hand, by having a support wafer with a thick oxide layer and fusing the first active wafer to the thicker oxide, junction capacitances can be eliminated and separation of devices can be provided by deep milling and etching down to the interface oxide.

The invention and objects and features thereof will be more readily apparent from the following detailed description and appended claims when taken with the drawing, in which:

BRIEF DESCRIPTION OF THE DRAWINGS

FIGS. 1-9 are section views of a semiconductor structure in accordance with the invention showing the steps in fabricating the structure including the fabrication of contacting and non-contacting feedthroughs.

FIGS. 10A and 10B are a section view and electrical schematic of an MOS transistor and capacitor memory bit in accordance with an embodiment of the invention.

FIGS. 11A and 11B are a section view and schematic of a CMOS inverter in accordance with one embodiment of the invention.

FIG. 13 is a description of symbols utilized in illustrating a multilayer circuit in accordance with the invention.

DESCRIPTION OF THE PREFERRED EMBODIMENTS

Figure 5:
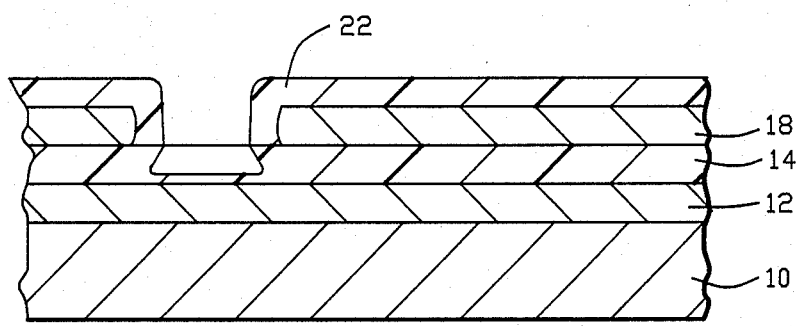
Figure 6:
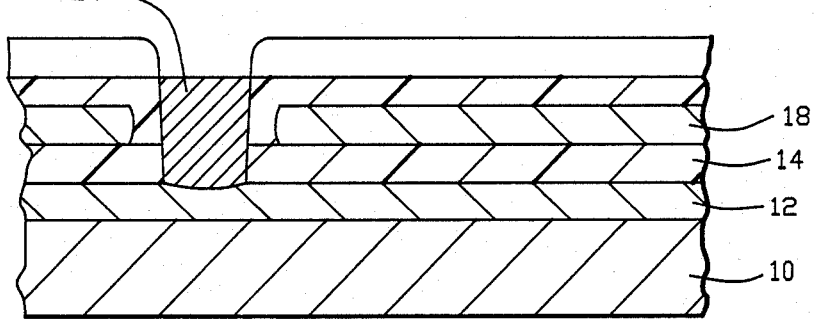

Referring now to the drawings, FIGS. 1-9 are section views illustrating steps in fabricating an integrated circuit in accordance with the invention. As illustrated in FIG. 1, a first silicon semiconductor substrate 10 includes an epitaxial layer 12 grown thereon and a silicon oxide layer 14 grown on the epitaxial layer 12. A second silicon substrate 16 has an epitaxial layer 18 on the surface thereof, and a silicon oxide layer 20 is formed on the surface of the epitaxial layer 18. In accordance with the invention, the two substrates are placed together with the silicon oxide layers 14, 20 in abutment as illustrated in FIG. 2. The two oxide layers are fused together by heating the stacked structure to a temperature in the range of 800°-1200° C. This causes the silicon oxide layers to fuse together without any lateral distortion on either wafer. The time and temperature for the fusion step is limited to prevent "drive-in" of the ions. After the stacked device is completed a final heat treatment is provided for uniform "drive-in" in the stacked layers.

As illustrated in FIG. 3, the substrate 16 is removed by chemical etching thereby leaving the silicon substrate 10 as a supporting substrate for the epitaxial layer 12 and the epitaxial layer 18 with the two epitaxial layers being separated by the fused oxide layers labeled 14. The removal of substrate 16 by etching utilizes the strong dependence in the etch rate on the resistivity of the semiconductor material. For example, heavily doped wafers with a thin epitaxial layer of much lighter doping can be etched from the back with enough control to leave only the thin epitaxial layer, as shown in FIG. 3. In this case, wafer 10 can be protected from the etch by a suitable photoresist mask.

The fusion and etchant steps illustrated in FIGS. 1-3 can be repeated to form a multilayer structure as required for a particular three dimensional integrated circuit with the circuit components fabricated in the epitaxial layers and with the epitaxial layers electrically isolated by an insulating layer such as silicon oxide, silicon nitride, or other feasible materials. Each layer after fusing and thinning can be processed to contain the devices and interconnection vias to the underlying layers.

In order to manufacture circuits with multiple layers having distinct circuit functions in each layer, the successive layers must be accurately aligned. In one approach the individual circuits are fabricated in the wafers before fusion of the wafers. In this approach the placement of one wafer on top of the other is made by accurate lateral displacement using mechanical/optical alignment techniques or by the use of laser drilled holes that can function as a reference point for alignment. However, the preferred method of alignment takes advantage of the topology feedthrough to the unprocessed thin epitaxial layer after thinning. An alignment mark can be incorporated in the processing of the previous layer. If the new layer is thinner than approximately one micron most of the visible spctrum can penetrate the layer making it possible to see an alignment mark of sufficient contrast and thus permitting the use of standard mask aligners. For thicker layers short wavelength fringes due to the topology make it possible to locate an alignment mark that touches the new layer. The process of fusion and thinning can be repeated for increased stacking of layers, but with increased layers comes a reduction in production yield. Three or four epitaxial layers on a supporting substrate is a optimum structure using conventional process techniques.

Consider now the fabrication of a multilevel dynamic random access memory the fabrication of which is illustrated in the cross sectional views of FIGS. 4-10. FIG. 4 illustrates the initial etching of the structure for an interconnect via through the use of reactive ion etching, for example. In FIG. 5 an oxide layer 22 is grown over the etched surface, and in FIG. 6 the oxide is removed from the bottom of the etched hole whereby deposited silicide 24 (e.g. tungsten silicide or polysilicon) can physically and electrically contact the epitaxial layer 12 without contacting layer 18.

Figure 7:
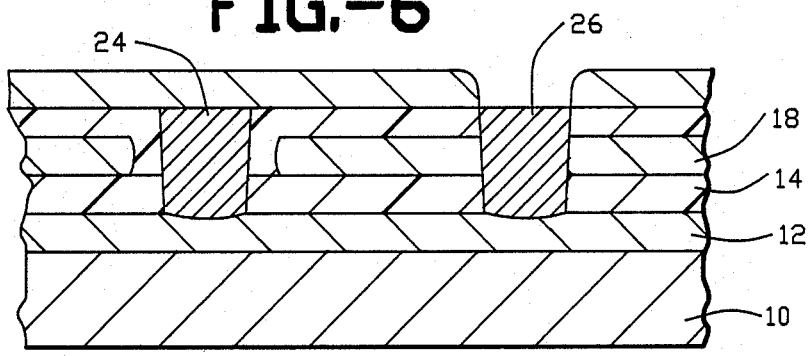
Figure 8:
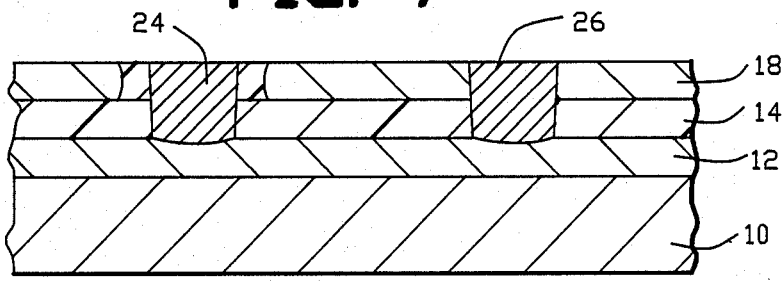

FIG. 7 shows a second milling/deposition step used to interconnect circuits in layers 18 and 12. The completion of the operation involves resist and oxide removal and surface cleaning, FIG. 8, and oxidation, FIG. 9. In FIGS. 7 and 8 a similar interconnect via 26 is formed in which the epitaxial layers 12 and 18 are electrically interconnected. In FIG. 9 the top surface of an epitaxial layer 18 is oxidized before fusion of a third wafer.

FIG. 10A illustrates a similar stacked structure including two additional epitaxial layers 28 and 29 separated by oxide 30 formed on the structure. An MOS transistor 31 is formed in the top epitaxial layer 29 by diffusing a P-region 32 in N layer 29. A word line is provided by a metal or silicide layer 33 formed on a silicon oxide layer 34 on the surface of epitaxial layer 28. The bit line 36 is formed in the top epitaxial layer 28 and consists of N+silicon. A capacitor 38 includes a portion of epitaxial layer 29 and underlying portions of epitaxial layer 28, 18, and 12. The completed circuit is shown schematically in FIG. 10B.

The memory structure of FIG. 10A results after three fusion and thinning operations plus normal processing of the top layer. It will be noted that essentially only two masks are required to build the lower layers of the multilayer capacitor. The function of the two masks are interchanged at the addition of the next layer while a third mask will be used for surrounding the capacitor layers with an insulating zone. In its simplest form the insulation is accomplished by milling or reactive ion etching through the epitaxial layer thus creating a void when the next wafer is fused. Alternatively, the insulation zone can be a silicon oxide or silicon nitride.

Using the techniques described above a simple CMOS circuit can be readily fabricated. This is illustrated in FIGS. 11A and 11B which show a CMOS inverter in three layers. The middle epitaxial layer is used primarily for gate electrodes and for interconnection from outputs to the gates. The field insulation is provided by voids created by milling, as described above. The sum of the oxide layers on the two fused wafers defines the thickness of the gate oxide. The practical controllable thickness of the semiconductor layer is considerably less than one micron, which makes it feasible to change the full depth of the layer by ion implant and drive-in. The formation of the transistors can be either by implant of P dopant into an N layer or by implant of N dopant into a P layer. The simplicity of the CMOS circuits helps in reducing the chip area required for the sense amplifiers in a dynamcc random access memory such as described above with reference to FIG. 10A The routing of signals if the successive silicon oxide layers are only a few hundred angstroms apart could lead to excessive capacitive loads. This is easily corrected by milling and thereby creating a void at crossovers.

Figure 12A:
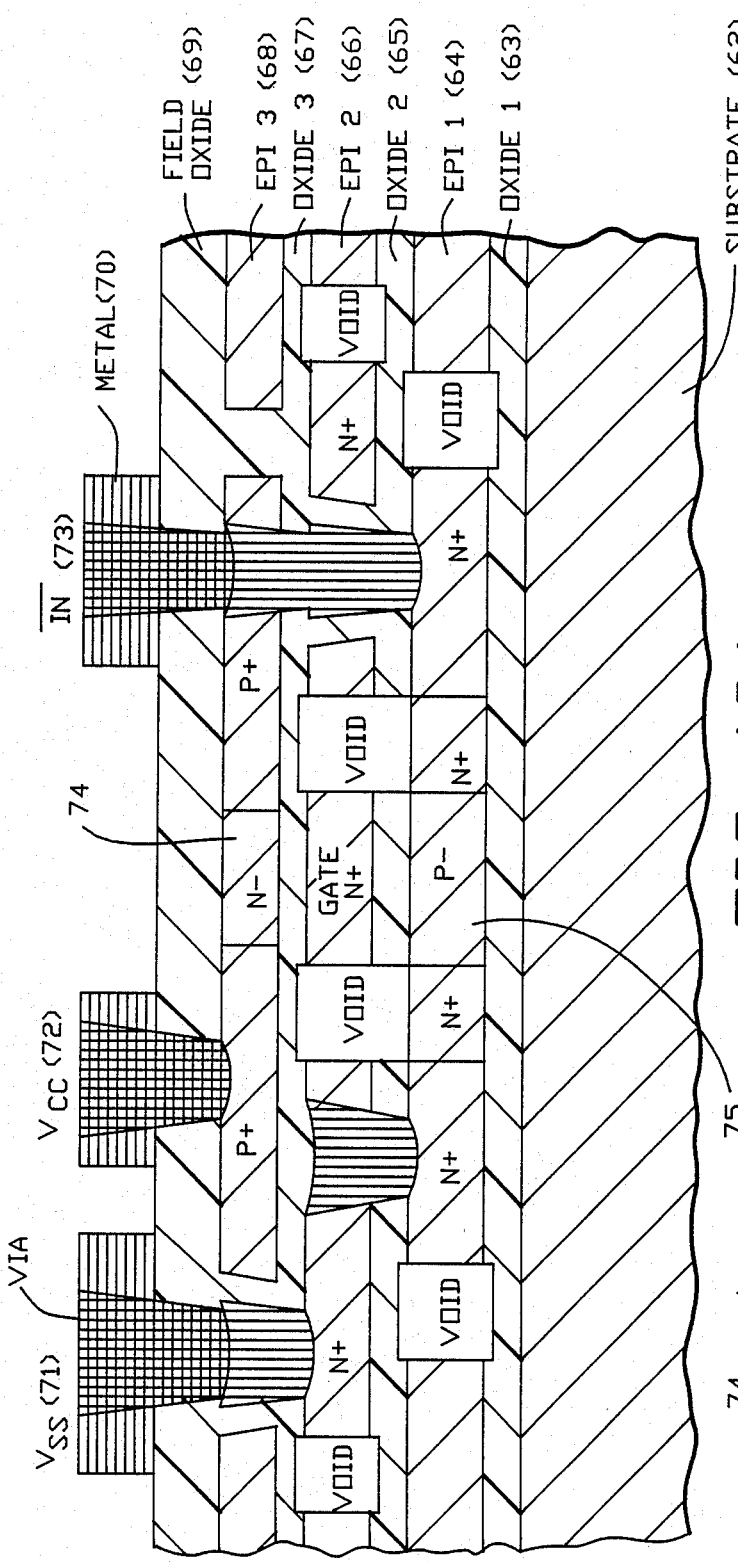
FIGS. 12A and 12B are a second view and a schematic of a CMOS inverter in accordance with another embodiment of the invention.
Figure 12B:
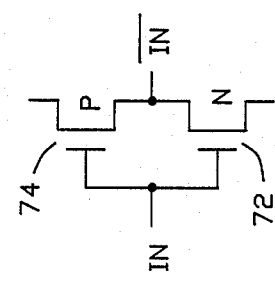

FIGS. 12A and 12B are a section view and a schematic, respectively, of an inverter in accordance with another embodiment of the invention. The embodiment is similar to the embodiment of FIGS. 11A and 11B except that the substrate 62 provides only support and does not accommodate any electrical devices. Such a structure increases speed of circuit operation and obviates the need for junction or oxide isolation within the substrate.

The substrate 62 supports in order a first oxide layer 63, a first epitaxial layer 64, a second oxide layer 65, a second epitaxial layer 66, a third oxide layer 67, a third epitaxial layer 68, a field oxide layer 67, and metal layer 70.

The n-channel transistor 75 is formed in the first epitaxial layer 64, the p-channel transistor 74 is formed in the third epitaxial layer 68, and the common gate is formed in the second epitaxial layer 66. The metal 55 via 71 contacts a silicide or polysilicon contact to the second epitaxial layer, the metal VCC contact 72 contacts the third epitaxial layer 68, and the $\overline{IN}$ metal contact 73 contacts the first and third epitaxial layers 64, 68. Oxide isolation and void isolation is employed as described above.

Figures 14A, 14B, 14C:
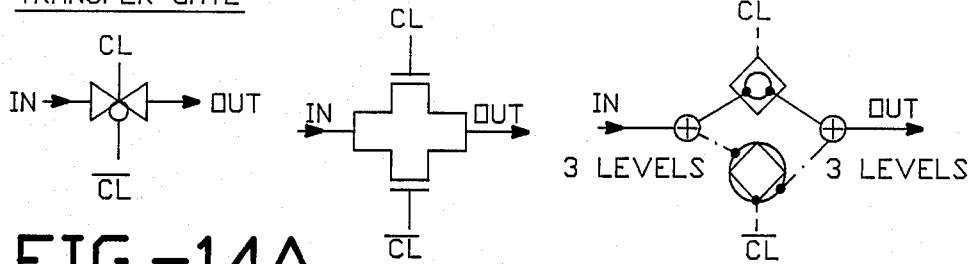
FIGS. 14A-14C illustrate symbolically a transfer gate.
Figures 15A, 15B, 15C:
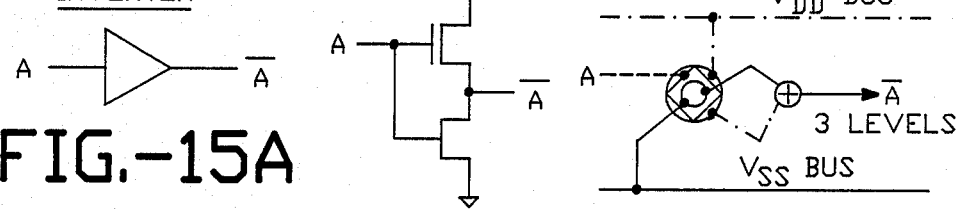
FIGS. 15A-15C illustrate symbolically an inverter.
Figure 16A:
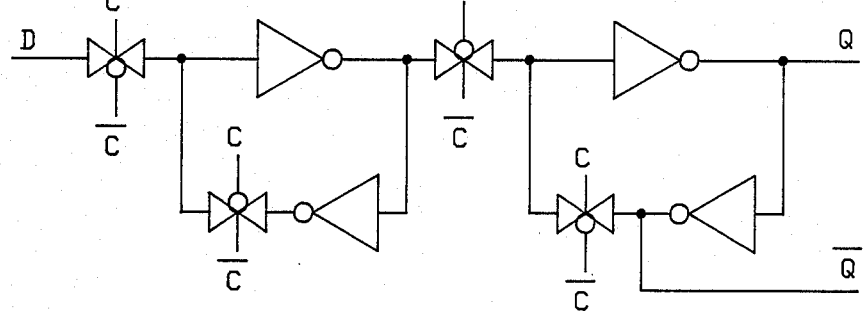
FIGS. 16A and 16B illustrate schematically a D flip-flop circuit.
Figure 16B:
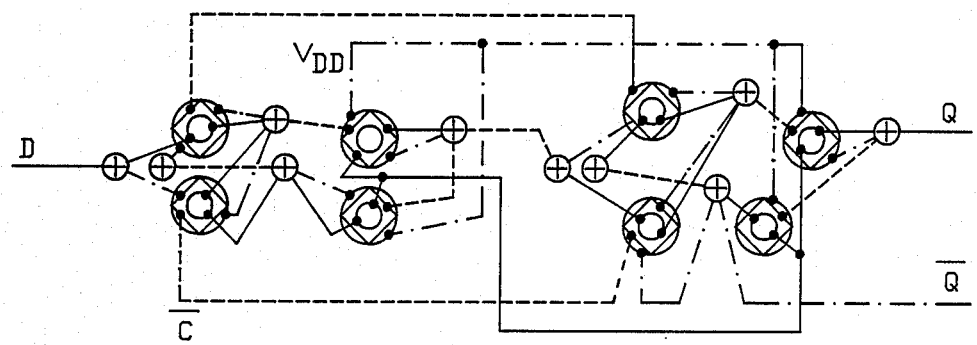
Figure 17:
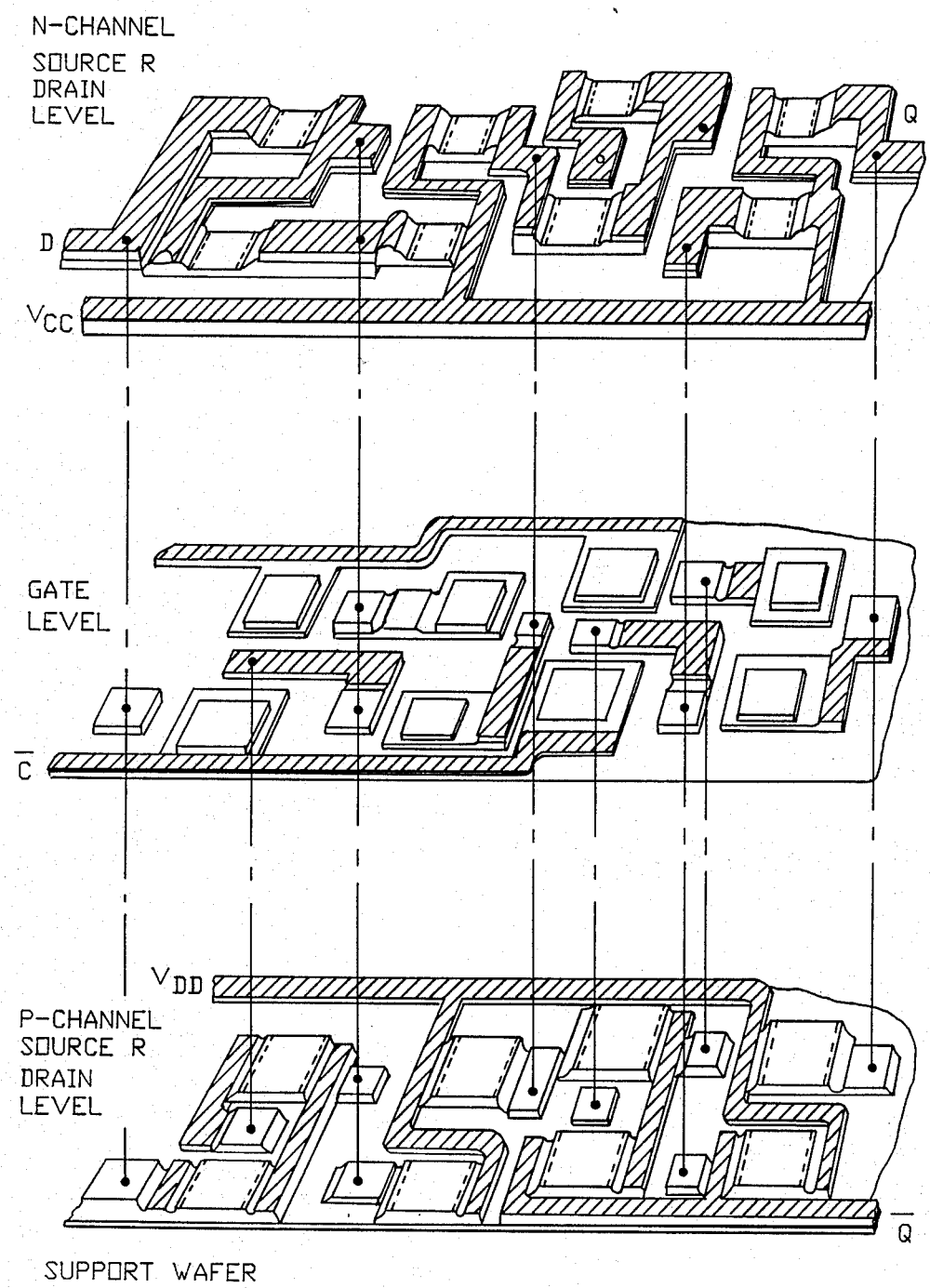
FIG. 17 is a perspective view of the flip-flop circuit of FIGS. 16A and 16B in a multilayer integrated circuit in accordance with the invention.

Considering the advantage of the optical alignment by looking through the last applied epitaxial layer, the preferred arrangement is to fuse an unprocessed wafer to the processed layer on the support wafer. This is illustrated for a D flip-flop in a three level structure shown in the exploded perspective view of FIG. 17. The layout of the circuitry of FIG. 17 can be more fully appreciated using the symbols for layout planning illustrated in FIG. 13, the symbols for a transfer gate as illustrated in FIG. 14, the symbols for an inverter illustrated in FIG. 15, and the schematic of the flip-flop in FIGS. 16A and 16B using the symbols of FIGS. 13–15. As noted from the schematics, the flip-flop comprises four transfer gates and four inverters fabricated from CMOS transistor pairs. In the three level layout of FIG. 17, the first level accommodates the P channel transistors, the second level provides the gates for the transistor pairs, and the top or third level provides the N channel transistors. Interconnect vias are provided as indicated by the dots on each level and the lines interconnecting the dots. The fusion of the silicon oxide of the several layers occurs only where the oxide contacts the adjacent layer. Voids are formed elsewhere in the layers to provide electrical isolation, as described above.

A multilevel integrated circuit in accordance with the invention increases circuit density and facilitates the stacked formation of circuit components such as CMOS transistor pairs and capacitors. By fusing silicon oxide layers on several substrates and then removing all but one bulk substrate by chemical etching, the total height of the multilevel structure can be limited to the thicknesses of the epitaxial layers and the fused silicon oxide material along with the one supporting substrate.

While the invention has been described with reference to specific embodiments, the description is illustrative of the invention and is not to be construed as limiting the invention. For example, lateral bipolar transistors and circuits can be formed in the layers of the structure. Thus, various modifications and applications may occur to those skilled in the art without departing from the true spirit and scope of the invention as defined by the appended claims.

What is claimed is:

1. In the fabrication of multilevel semiconductor integrated circuits, a method of forming devices in multilayers of silicon semiconductor material comprising the steps of providing a first silicon semiconductor substrate having a first silicon compound dielectric layer on a surface of said substrate, providing a second silicon semiconductor substrate having a first silicon epitaxial layer on one surface and a second silicon compound dielectric layer on a surface of said second epitaxial layer, stacking said second silicon semiconductor substrate on said first silicon semiconductor substrate with said first and second silicon dielectric layers in contact, fusing said dielectric layers together, removing said second substrate by etching thereby leaving said first substrate as a support for said first epitaxial layer, forming elements of an electrical device in said first epitaxial layer using photoresist masking, providing a third silicon compound dielectric layer on the surface of said first epitaxial layer, providing a third silicon semiconductor substrate having a second silicon epitaxial layer on one surface and a fourth silicon compound dielectric layer on the surface of said third epitaxial layer, stacking said fourth dielectric layer on the third dielectric layer on said first epitaxial layer, fusing said fourth dielectric layer to said third dielectric layer on said surface of said first epitaxial layer, removing said third silicon semiconductor substrate by etching thereby leaving said first substrate as a support for said first and second silicon epitaxial layers, forming elements of an electrical device in said second epitaxial layer using photoresist masking and wherein a photomask is optically aligned by looking through said second epitaxial layer to alignment marks on said first epitaxial layer, and providing conductive vias between said first epitaxial layer and said second epitaxial layer for interconnecting electrical components in said first and second epitaxial layers.

2. The method as defined by claim 1 and further including the steps of providing a fifth silicon compound dielectric layer on the surface of said second silicon epitaxial layer, providing a fourth silicon semiconductor substrate having a third silicon epitaxial layer on one surface and a sixth silicon compound dielectric layer on a surface of said third epitaxial layer, stacking said fourth semiconductor substrate and said third epitaxial layer on said second epitaxial layer with said fifth and sixth dielectric layers in contact, fusing said fifth and sixth dielectric layers together, removing said fourth substrate by etching thereby leaving said third epitaxial layer, forming elements of an electrical device in said third epitaxial layer using photoresist masking and wherein a photomask is optically aligned by looking through said third epitaxial layer to alignment marks after fusing said third epitaxial layer to said second epitaxial layer, providing conductive vias between said second epitaxial layer and said third epitaxial layer, forming a source and a drain of a first field effect transistor in said first epitaxial layer, forming a source and a drain of a second field effect transistor in said third epitaxial layer, and forming a gate electrode in said second epitaxial layer for said first and second field effect transistors, said first and second field effect transistors forming a CMOS transistor pair.

* * * * *